(12) United States Patent
Wright

(10) Patent No.: US 6,465,930 B1
(45) Date of Patent: Oct. 15, 2002

(54) TRANSDUCER WITH SURFACE ACOUSTIC WAVES WITH LOW GAP

(75) Inventor: Peter Wright, Biot (FR)

(73) Assignee: Thomson-CSF, Paris (FR)

( * ) Notice: Subject to any disclaimer, the term of this patent is extended or adjusted under 35 U.S.C. 154(b) by 0 days.

(21) Appl. No.: 09/701,367

(22) PCT Filed: May 28, 1999

(86) PCT No.: PCT/FR99/01266
§ 371 (c)(1),
(2), (4) Date: Nov. 29, 2000

(87) PCT Pub. No.: WO99/63663
PCT Pub. Date: Dec. 9, 1999

(30) Foreign Application Priority Data

May 29, 1998 (FR) .............................. 98 06835

(51) Int. Cl.$^7$ ................................. H03H 9/25
(52) U.S. Cl. .............................. 310/313 B; 310/313 R; 333/193; 333/195
(58) Field of Search .................. 310/313 R, 313 B; 333/193–195

(56) References Cited

U.S. PATENT DOCUMENTS 4,130,813 A * 12/1978 Sandy et al. .................. 333/72
4,353,046 A * 10/1982 Hartmann .................... 333/194
5,162,689 A   11/1992 Fliegel et al. ............ 310/313 B

FOREIGN PATENT DOCUMENTS

| GB | 2 106 346 A | * | 4/1983 | ............. 310/313 B |
| JP | 56-64509 | * | 6/1981 | ............. 310/313 B |
| JP | 3-80709 | * | 4/1991 | ............. 310/313 B |
| JP | 4-68607 | * | 3/1992 | ............. 310/313 B |
| JP | 5-63489 | * | 3/1993 | ................. 333/193 |
| WO | WO 82 01629 |   | 5/1982 | ............. H03H/9/25 |

OTHER PUBLICATIONS

Hines, J. H., et al: High Frequency Saw Devices, 1997, IEEE MTT–S International Microwave Symposium Digest, Denver, Jun. 8–13, 1997, vol. 1, Jun. 8, 1997, pp. 177–180, XP000767185, Institute of Electrical and Electronics Engineers ISBN: 0–7803–3815–4.

* cited by examiner

Primary Examiner—Thomas M. Dougherty
(74) Attorney, Agent, or Firm—Oblon, Spivak, McClelland, Maier & Neustadt, P.C.

(57) ABSTRACT

A small gap surface acoustic wave transducer, which has a very small free surface between consecutive electrodes, thus being able to operate a very high frequency (of the order of several gigahertz. The transducer of the invention includes a grating of etched grooves separated by mesas in the substrate. This array is covered with a metallization layer, making up the electrodes, which makes it possible to obtain the transducer in a direct manner.

21 Claims, 4 Drawing Sheets

TRANSDUCER WITH SURFACE ACOUSTIC WAVES WITH LOW GAP

The field of the invention is that of surface acoustic wave transducers operating at very high frequencies, typically at-frequencies of the order of several gigahertz.

Conventionally, transducers are typically fabricated by using structures of two, four or eight electrodes per wavelength $\lambda$, where $\lambda$ corresponds to the central operating frequency of the transducer, depending on the intended applications (transducer with or without reflection). In all these types of transducers, the ratio of the area of the metallized surfaces of the substrate to the area of the free surfaces generally used is typically between 0.25 and 0.75.

A new class of transducers has now come into being. These are the so-called small-gap transducers, in which the free surface is very small so as to obtain the smallest possible distance between two consecutive electrodes as illustrated in FIG. 1. The advantages of this type of transducer lie in the fact that it is possible to obtain electrode widths which are as large as possible, per period, therefore with strongly decreasing reflection phenomena between electrodes. The drawback of these structures lies in the technological difficulties. By way of example, for a transducer operating at 16 GHz, electrodes of width $\lambda/2$, i.e. 1.5 $\mu$m, have to be separated by a distance of about a few hundred angstroms, which requires an exacting technology. Various technologies have been proposed and especially that proposed by J. H. Hines and D. C. Malocha, IEEE MTT-S *International Microwave Symposium Digest* (Cat. No. 97CH3607), (1997), Denver, Colo., USA, Jun. 8–13, 1993). According to this concept, the conventional production of electrodes is carried out according to the metallization/free surface ratio of about 50/50, as illustrated in FIG. 2a. The whole of this first series of electrodes is covered with a layer of dielectric material (FIG. 2b). A second series of electrodes is then produced as illustrated in FIG. 2c. It is thus possible to obtain electrodes separated by a very small distance corresponding to the thickness of the layer of dielectric material, however the second series of electrodes is not in direct dielectric contact with the piezoelectric substrate, thus generating a coupling of lower efficiency.

Furthermore, this technology inherently leads to structures without possible reflection and therefore, necessarily, to bidirectional transducers.

In this context, the invention proposes a novel type of transducer of the small-gap transducer type, obtainable by a simple technology and leading to transducers which do not have a coupling problem. According to the invention, the gap between consecutive electrodes is obtained in a direction perpendicular to the plane of the substrate and by virtue of the presence of an etched grating.

More specifically, the subject of the invention is a surface acoustic wave transducer operating at frequencies of the order of a few gigahertz and comprising a substrate on which at least two interdigitated electrode arrays are deposited and connected to different polarities, so as to create acoustic transduction cells, which are defined by at least two consecutive electrodes of different polarities, characterized in that it comprises:

- a grating of etched grooves separated by mesas, in the substrate;
- all of the mesas and of the etched grooves being entirely covered with a metallization layer making up the electrodes;
- the depth of the etched grooves being greater than the thickness of the metallization layer so as to create a gap, of the order of a few hundred angstroms in a direction perpendicular to the plane of the substrate, between two consecutive electrodes.

This type of transducer has the benefit of being able to be produced directly. This is because, after having firstly made an etched grating with the desired periodicity, it is enough to subsequently proceed to the metallization of the whole of the surface of the etched grating.

Note that, in order to minimize the sensitivity to the production, it may be beneficial to make the mesas wider than the etched grooves.

Advantageously, the small-gap transducer according to the invention may have a favored acoustic wave propagation direction.

Note that in the known art it has already been proposed to produce transducer architectures using mesas and etched grooves (WO 82/01629) but aiming for other application fields/transducers operating at megahertz frequencies, with much larger gaps and with metallizations that are not continuous between mesas and etched grooves.

Thus, according to a first variant of the invention, the distance between two consecutive electrodes is equal to $\lambda/4$, and is also equal to the distance between a mesa and a consecutive etched groove. The sidewalls of the etched groove create reflections which make it possible for the transmitted waves to be returned in phase with the reflected waves in a favored direction and in the phase opposition in the opposite direction so as to obtain a unidirectional transducer, also called a SPUDT (Single-Phase Unidirectional Transducer). In this type of transducer, it has moreover been demonstrated that it could be beneficial to produce resonant cavities inside said transducer, this is described in particular in the published patent application Ser. No. 2,702,899. In order to create a resonant cavity, it is necessary to locally modify the directivity of the surface acoustic waves. To do this, the phase is conventionally varied by shifting one electrode locally, something which is not straightforward from a technological point of view.

According to the invention, it becomes very simple to change the directivity, by locally making an etched groove of larger width, typically twice as large.

According to a second variant of the invention, the small-gap transducer is a bidirectional transducer having a period of $\lambda/2$. Generally, this type of transducer has a very good coupling coefficient and a critical dimension in $\lambda/2$ technology, and therefore is easier to produce than the transducers having a configuration of four electrodes per $\lambda$.

According to a third variant of the invention, the small-gap transducers comprises etched grooves and mesas of $\lambda/3$ period. This type of transducer has the advantage of strongly minimizing the marked reflections from electrodes, the objective sought after in certain applications.

The invention will be better understood and other advantages will appear on reading the following description given by way of nonlimiting examples and with reference to the appended figures among which:

FIG. 3b illustrates a second example of a small-gap transducer according to the invention having a favored wave propagation direction opposite to that of the example of FIG. 3a;

Generally, the surface wave transducers according to the invention comprise a substrate which may be of the quartz type, etched first then subsequently metallized by a metal of the aluminum type. The substrates used may advantageously be of the $LiNbO_3$, $LiTaO_3$ or even $Li_2B_4O_7$ type. Currently, there are well-controlled techniques for etching on substrates of the quartz type and in particular there is the so-called ICP (Inductively Coupled Plasma) technique using a high-energy plasma and enabling the low-cost mass production of etched devices.

According to a first variant of the invention, the small-gap transducer has a favored surface acoustic wave propagation direction conferred by a configuration comprising 4 electrodes per wavelength $\lambda$, with reflection centers located at a distance of $\lambda/8$ with respect to transduction centers.

Figure 1:
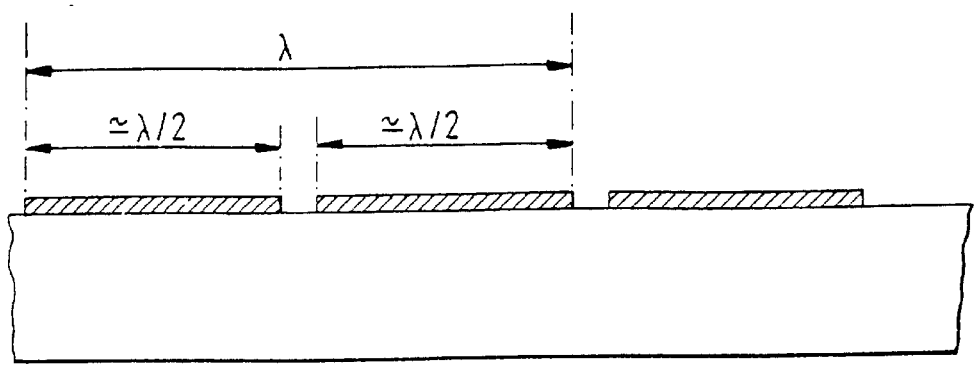
FIG. 1 illustrates a small-gap transducer according to the known art.
Figure 2A:
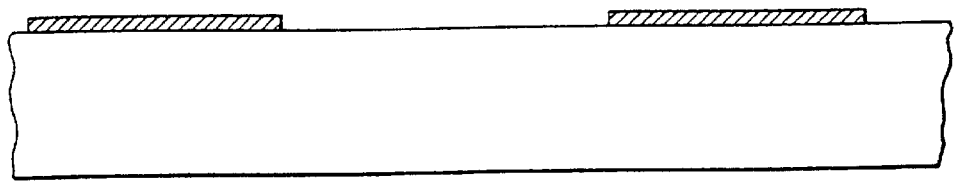
FIGS. 2a to 2c illustrate the various stages of a process of the known art in order to make a small-gap transducer.
Figure 2B:
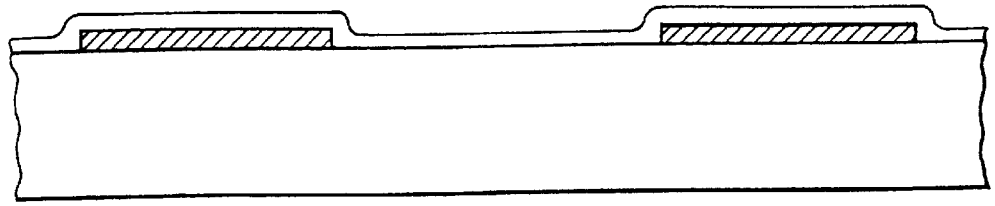
Figure 2C:
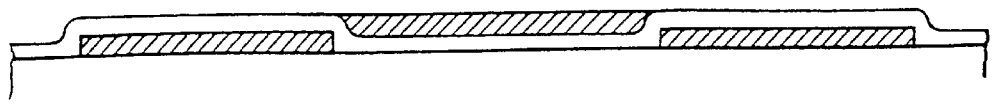
Figure 3A:
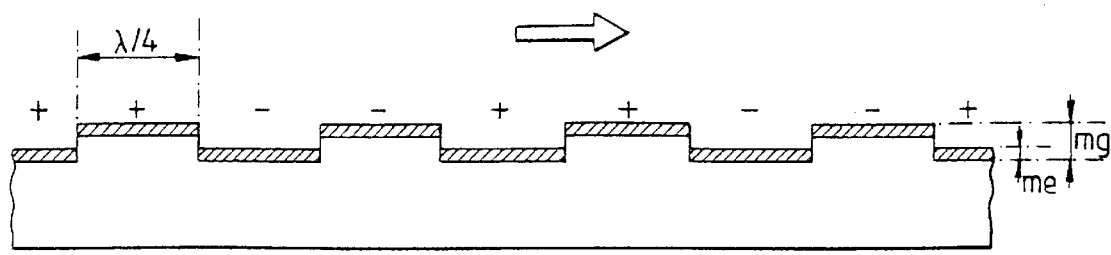
FIG. 3a illustrates a first example of a small-gap transducer according to the invention having a favored acoustic wave propagation direction.

According to the example described in FIG. 3a, the electrodes deposited on the surface of the mesas and of the etched grooves have a width of $\lambda/4$. Two electrode arrays have pairs of electrodes referenced by the+and−signs in FIG. 3a, so as to create acoustic transduction centers and reflection centers such that the transmitted waves are returned in phase with the reflected waves.

In all the configurations of the invention, it is essential that the metallization thickness $m_e$ be less than the etching depth $m_g$ as illustrated in FIG. 3a.

Figure 3B:
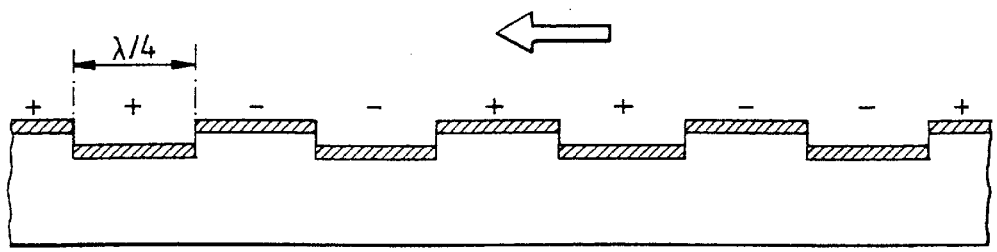

According to another example of the invention illustrated in FIG. 3b, it is possible to reverse the acoustic wave propagation direction by reversing the mesas and the etched grooves with respect to the configuration described in FIG. 3a.

Figure 3C:
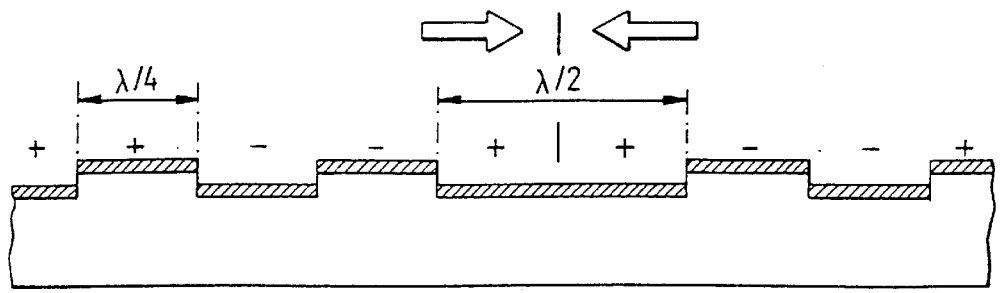
FIG. 3c illustrates a third example of a small-gap transducer according to the invention having a local change of favored direction of the acoustic wave.

In the same way as in the known art and especially as described in the patent application published under the U.S. Pat. No. 2,702,899, filed by the applicant, it could be beneficial to locally turn back the directivity of the surface waves so as to create resonant cavities as illustrated in FIG. 3c. In order to do this, it is enough to create an etched groove having a width twice that of $\lambda/2$ locally with the aid of the etching mask used during the operation of etching the substrate.

Figure 4:
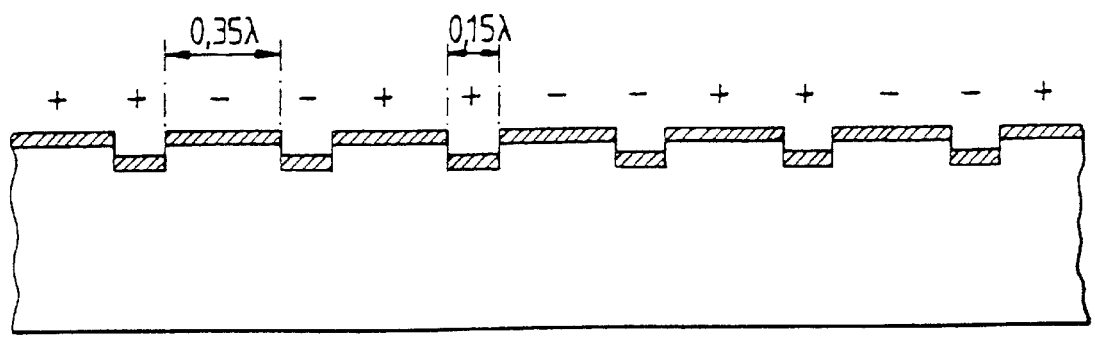
FIG. 4 illustrates a fourth example of a small-gap transducer comprising different widths of mesas and of etched grooves.

FIG. 4 illustrates a variant of this type of unidirectional transducer, in which the period of the mesas or of the etched grooves is equal to $\lambda/4$. From a technological point of view, it may be beneficial to make the mesas of a greater width than that of the etched grooves, while maintaining the desired periodicity. According to the example illustrated in FIG. 4, the width of a mesa may typically be about $0.35\lambda$, while the width of an etched groove is typically about $0.15\lambda$.

The unidirectional transducers that have just been described have very good coupling performance. Generally, this is because the unidirectional transducers must have in their electrode sequence an asymmetry responsible for the unidirectionality (at the expense of bidirectionality ensured by a perfectly symmetric structure). However, this favored direction is obtained at the cost of a less satisfactory coupling coefficient.

According to the configuration proposed in the invention, the surface wave transducer preserves perfect electrode symmetry, the asymmetry needed to create the favored wave propagation direction is created by virtue of the presence of an etched grating. The marked reflections from the electrodes are symmetric with respect to each other and do not create a favored direction, while the etched sidewalls cause reflections to appear, which do not offset each other between a given direction and the opposite direction. The invention thus makes it possible to obtain small-gap unidirectional transducers, whereas the small-gap transducers of the prior art are solely bidirectional, with strong marked reflections from the electrodes.

According to a second variant of the invention, the small-gap surface wave transducer may have a configuration of two electrodes per wavelength $\lambda$. Such transducers are bidirectional and have excellent coupling coefficients in comparison with other types of transducers and especially with unidirectional transducers of 4 electrodes per $\lambda$.

Figure 5:
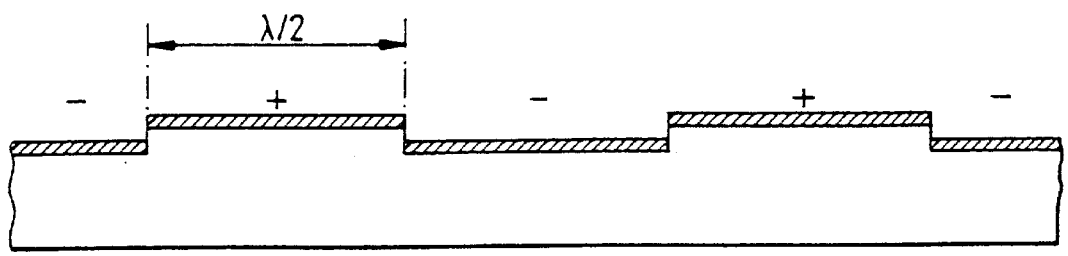
FIG. 5 illustrates a fifth example of a small-gap transducer according to the invention having a period of $\lambda/2$ and being bidirectional.

The implantation of electrodes for this type of structure is illustrated in FIG. 5. In this structure, the etched sidewalls did not introduce, as previously, reflections making it possible to create unidirectionality but are present solely to create the gap between two consecutive electrodes. The magnitude of the electrode reflection coefficient may advantageously be adjusted as a function of the etching depth, while still keeping a small metallization thickness.

Generally, the structures of transducers with two electrodes per $\lambda$ are chosen for resonator applications because of the strong reflections created by the electrodes which allow the surface waves to resonate efficiently, because the transmitted and reflected waves are put in phase (distance of $\lambda/2$ between two consecutive electrode centers). In some applications, it is possible to adjust the resonant character of this type of structure while maintaining the very good coupling coefficient conferred by the structures with 2 electrodes per $\lambda$.

Figure 6:
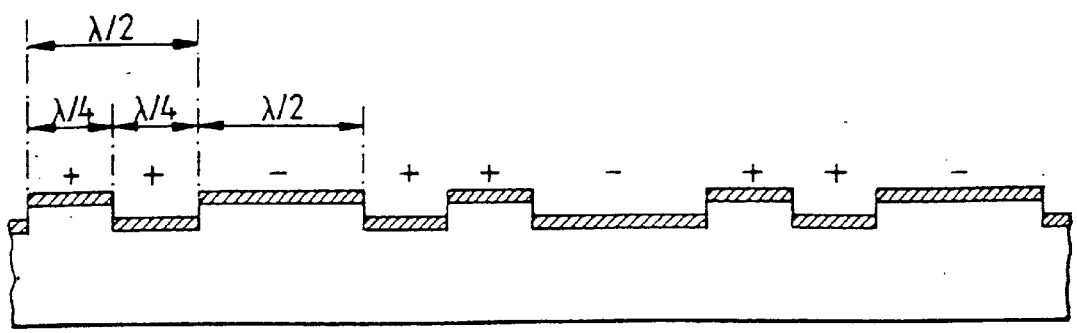
FIG. 6 illustrates a sixth example of a small-gap transducer according to the invention, being bidirectional and whose reflectivity is adjusted by the period of the etched grating.

According to the invention and by virtue of the superposition of the electrode arrays and of an etched grating, this is possible by positioning some electrodes astride a mesa and an etched groove as illustrated in FIG. 6. The electrodes still have a width of $\lambda/2$, but some electrodes have a modified reflection coefficient, in which a contribution from reflection off the electrode and a contribution from reflection off the etched sidewall are included. These contributions tend to oppose each other so as to reduce the overall reflection coefficient of some electrodes and thus to lessen the marked electrode reflection phenomena, which are generally very significant in this type of transducer.

We will now describe some types of transducers (4 electrodes per $\lambda$ and 2 electrodes per $\lambda$); note that, generally, the invention is applicable to any type of transducer, calling on a technology which allows a great deal of latitude with regard to electrode widths (they can just as well be of width $\lambda/3$), while maintaining the small-gap character still to govern the depth of the etched groove.

Figure 7:
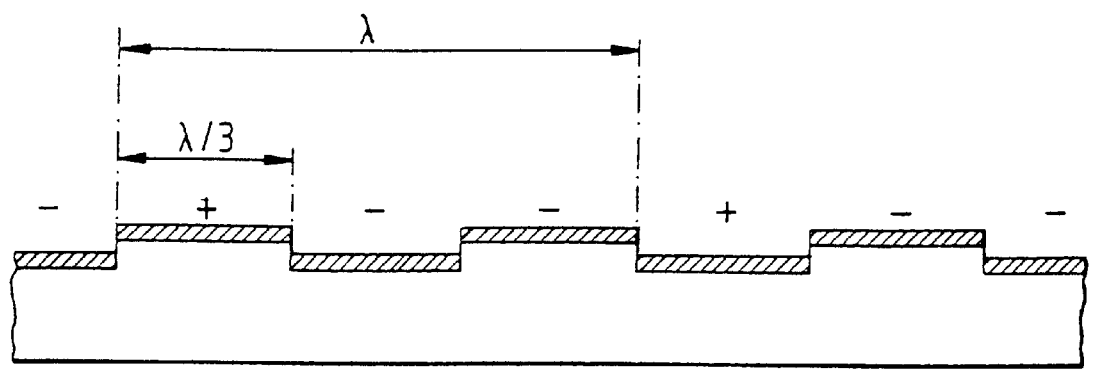
FIG. 7 illustrates a seventh example of a small-gap transducer according to the invention, being bidirectional and of the type having 3 electrodes per $\lambda$.

More specifically, we will describe transducers according to the invention, with small gap and having an electrode period and a mesa period both equal to $\lambda/3$. With this type of configuration, the marked reflections are minimized. FIG. 7 illustrates an example of this type of transducer; this is a bidirectional transducer, comprising two electrode arrays connected respectively to a first and a second polarity denoted by the+and−signs respectively. Over a length equal to the wavelength λ, the first array comprises a first electrode, the second array comprises a second and a third electrode.

Figure 8:
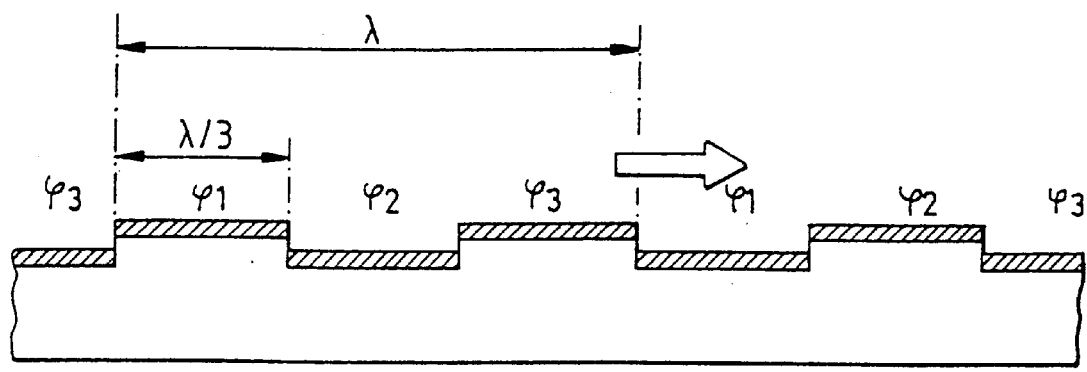
FIG. 8 illustrates an eighth example of a small-gap transducer according to the invention, being unidirectional and of the type having 3 electrodes per $\lambda$.

A variant of this type of transducer is a transducer, still with 3 electrodes per λ, but made unidirectional by using, not two electrode arrays, but three electrode arrays. FIG. 8 illustrates such a Transducer in which the three polarities of the three electrode arrays are denoted by the symbols φ1, φ2 and φ3.

What is claimed is:

1. A surface acoustic wave transducer comprising a substrate on which at least two interdigitated electrode arrays are deposited, wherein said surface acoustic wave transducer comprises:
    a grating of etched grooves separated by mesas, in the substrate; and
    a metallization layer forming electrodes, said metallization layer covering entirely the mesas and the etched grooves,
    wherein the depth of the etched grooves is greater than the thickness of the metallization layer so as to create a gap between two consecutive electrodes, and
    wherein said mesas are wider than said etched grooves.

2. The surface acoustic wave transducer as claimed in claim 1, wherein acoustic waves propagate through said substrate at operating frequencies of the order of a few gigahertz.

3. The surface acoustic wave transducer as claimed in claim 1, comprising mesas and etched grooves having widths such that the total width of a mesa and of a consecutive etched groove is equal to a half-wavelength (λ/2), the wavelength being characteristic of an operating frequency of the transducer, the interdigitated electrode arrays comprising alternating electrode pairs, so as to create a favored direction of propagation of acoustic waves.

4. The surface acoustic wave transducer as claimed in claim 3, wherein at least one mesa or at least one etched groove has a width equal to the half-wavelength (λ/2), so as to locally reverse the favored direction of propagation of the acoustic wave.

5. The surface acoustic wave transducer as claimed in claim 1, comprising mesas and etched grooves having widths such that the total width of a mesa and of a consecutive etched groove is equal to a characteristic wavelength.

6. The surface acoustic wave transducer as claimed in claim 5, further comprising mesas and etched grooves having a width equal to a quarter-wavelength (λ/4), so as to make electrodes of width equal to a half-wavelength and positioned astride both a mesa and a groove in order to reduce the reflection coefficient of said electrodes.

7. The surface acoustic wave transducer as claimed in claim 1, wherein the period of the etched grooves and of the mesas is equal to one third of the characteristic wavelength at an operating frequency of the transducer.

8. The surface acoustic wave transducer as claimed in claim 7, comprising a first and a second interdigitated electrode array, such that, over a length equal to the characteristic wavelength, the first array comprises a first electrode connected to a first polarity, the second array comprising a second and a third electrode, both connected to a second polarity.

9. The surface acoustic wave transducer as claimed in claim 7, comprising a first, a second and a third interdigitated electrode array, there being connected to a first, a second and a third polarity respectively, such that, over a length equal to the characteristic wavelength, the transducer comprises an alternation of one electrode from the first array, one electrode from the second array and one electrode from a third array.

10. The surface acoustic wave transducer as claimed in claim 2, wherein said at least two interdigitated electrode arrays are connected to different polarities.

11. The surface acoustic wave transducer as claimed in claim 10, wherein said at least two interdigitated electrode arrays create acoustic transduction cells defined by at least two consecutive electrodes of different polarities.

12. The surface acoustic wave transducer as claimed in claim 11, wherein said gap is of the order of a few hundred angstroms.

13. The surface acoustic wave transducer as claimed in claim 12, wherein said gap is in a direction perpendicular to the plane of the substrate.

14. A surface acoustic wave transducer operating at frequencies of the order of a few gigahertz and, comprising a substrate on which at least two interdigitated electrode arrays are deposited and connected to different polarities, so as to create acoustic transduction cells, which are defined by at least two consecutive electrodes of different polarities, wherein said surface acoustic wave transducer comprises:
    a grating of etched grooves separated by mesas, in the substrate; and
    a metallization layer forming electrodes, said metallization layer covering entirely the mesas and the etched grooves; and
    a first, a second and a third interdigitated electrode array, there being connected to a first, a second and a third polarity respectively, such that, over a length equal to a characteristic wavelength, the transducer comprises an alternation of one electrode from the first array, one electrode from the second array and one electrode from a third array,
    wherein the depth of the etched grooves is greater than the thickness of the metallization layer so as to create a gap of the order of a few hundred angstroms in a direction perpendicular to the plane of the substrate, between two consecutive electrodes, and
    wherein the period of the etched grooves and of the mesas is equal to one third of the characteristic wavelength at an operating frequency of the transducer.

15. A surface acoustic wave transducer operating at frequencies of the order of a few gigahertz and, comprising a substrate on which at least two interdigitated electrode arrays are deposited and connected to different polarities, so as to create acoustic transduction cells, which are defined by at least two consecutive electrodes of different polarities, wherein said surface acoustic wave transducer comprises:
    a grating of etched grooves separated by mesas, in the substrate; and
    a metallization layer forming electrodes, said metallization layer covering entirely said mesas and said etched grooves,
    wherein the depth of the etched grooves is greater than the thickness of the metallization layer so as to create a gap of the order of a few hundred angstroms in a direction perpendicular to the plane of the substrate, between two consecutive electrodes, and
    wherein the mesas and the etched grooves have different widths.

16. The surface acoustic wave transducer as claimed in claim 15, comprising mesas and etched grooves having widths such that the total width of a mesa and of a consecutive etched groove is equal to a half-wavelength ($\lambda/2$), the wavelength being characteristic of the operating frequency of the transducer, the interdigitated electrode arrays comprising alternating electrode pairs, so as to create a favored direction of propagation of acoustic waves.

17. The surface acoustic wave transducer as claimed in claim 16, wherein at least one mesa or at least one etched groove has a width equal to the half-wavelength ($\lambda/2$), so as to locally reverse the favored direction of propagation of the acoustic wave.

18. The surface acoustic wave transducer as claimed in claim 15, comprising mesas and etched grooves having widths such that the total width of a mesa and of a consecutive etched groove is equal to a characteristic wavelength.

19. The surface acoustic wave transducer as claimed in claim 18, further comprising mesas and etched grooves having a width equal to a quarter-wavelength ($\lambda/4$), so as to make electrodes of width equal to a half-wavelength and positioned astride both a mesa and an electrode in order to reduce the reflection coefficient of said electrodes.

20. The surface acoustic wave transducer as claimed in claim 15, wherein the period of the etched grooves and of the mesas is equal to one third of the characteristic wavelength at an operating frequency of the transducer.

21. The surface acoustic wave transducer as claimed in claim 20, comprising a first and a second interdigitated electrode array, such that, over a length equal to the characteristic wavelength, the first array comprises a first electrode connected to a first polarity, the second array comprising a second and a third electrode, both connected to a second polarity.

* * * * *